(12) United States Patent
Shibata

(10) Patent No.: US 9,791,018 B2
(45) Date of Patent: Oct. 17, 2017

(54) VIBRATION ISOLATION APPARATUS, METHOD OF ISOLATING VIBRATION, LITHOGRAPHY APPARATUS, AND METHOD OF PRODUCING DEVICE

(71) Applicant: CANON KABUSHIKI KAISHA, Tokyo (JP)

(72) Inventor: Yugo Shibata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 195 days.

(21) Appl. No.: 14/320,342

(22) Filed: Jun. 30, 2014

(65) Prior Publication Data
US 2015/0014507 A1    Jan. 15, 2015

(30) Foreign Application Priority Data
Jul. 2, 2013 (JP) .................................. 2013-139005

(51) Int. Cl.
*F16M 13/00* (2006.01)
*F16F 15/04* (2006.01)
*G03F 7/20* (2006.01)

(52) U.S. Cl.
CPC .............. *F16F 15/04* (2013.01); *G03F 7/709* (2013.01); *F16F 2226/023* (2013.01); *Y10T 29/49764* (2015.01)

(58) Field of Classification Search
CPC ...... F16F 15/04; F16F 15/02; F16F 2226/023; G03F 7/709; G03F 7/70858
USPC ............... 248/550, 580, 581, 646, 651, 658; 267/140.11, 140.14, 160
See application file for complete search history.

(56) References Cited

U.S. PATENT DOCUMENTS

| | | | | |
|---|---|---|---|---|
| 4,181,028 A | * | 1/1980 | Talbott, Jr. ............ | G01M 7/022 73/665 |
| 5,427,362 A | * | 6/1995 | Schilling ................ | F16F 7/1011 188/267 |
| 5,876,012 A | * | 3/1999 | Haga .................... | F16F 15/0275 248/550 |
| 6,512,571 B2 | * | 1/2003 | Hara .................... | G03F 7/70725 355/53 |
| 7,063,192 B2 | * | 6/2006 | Mayama ................ | G03F 7/709 188/378 |
| 8,300,208 B2 | * | 10/2012 | Loopstra ............. | G03F 7/70525 355/53 |

(Continued)

FOREIGN PATENT DOCUMENTS

| | | |
|---|---|---|
| JP | 2009-047282 A | 3/2009 |
| JP | 2009-188053 A | 8/2009 |

(Continued)

*Primary Examiner* — Terrell McKinnon
*Assistant Examiner* — Michael McDuffie
(74) *Attorney, Agent, or Firm* — Canon U.S.A. Inc., IP Division

(57) ABSTRACT

A vibration isolation apparatus includes a support unit that elastically supports an object to a mounting surface, a measurement sensor that measures a displacement of the object relative to the mounting surface, a drive unit that drives the object, and a storage unit. The storage unit stores data indicating a relationship between the displacement of the object and information that indicates a non-linear force produced by an elastic element including a support unit and that corresponds to the displacement. The drive unit drives the object in accordance with the displacement of the object and the data.

9 Claims, 7 Drawing Sheets

(56) References Cited

U.S. PATENT DOCUMENTS

| | | | | |
|---|---|---|---|---|
| 8,751,050 B2* | 6/2014 | Heiland | G03F 7/70525 | 248/550 |
| 2002/0101253 A1* | 8/2002 | Pletner | F16F 15/005 | 324/727 |
| 2003/0090645 A1* | 5/2003 | Kato | F16F 15/02 | 355/72 |
| 2003/0111458 A1* | 6/2003 | Wakui | G03F 7/70858 | 219/494 |
| 2004/0124332 A1* | 7/2004 | Takenaka | B60K 6/405 | 248/648 |
| 2006/0279716 A1* | 12/2006 | Cox | G03F 7/709 | 355/53 |
| 2008/0170210 A1* | 7/2008 | Meijer | G03F 7/70841 | 355/30 |
| 2008/0316460 A1* | 12/2008 | Loopstra | G03F 7/70775 | 355/72 |
| 2009/0091733 A1* | 4/2009 | Wada | G03F 7/709 | 355/67 |
| 2009/0122284 A1* | 5/2009 | Butler | G03F 7/709 | 355/53 |
| 2009/0180091 A1* | 7/2009 | Farnsworth | F16F 9/06 | 355/67 |
| 2009/0262325 A1* | 10/2009 | Butler | G03F 7/70758 | 355/72 |
| 2010/0238424 A1* | 9/2010 | Van Empel | G03F 7/709 | 355/72 |
| 2011/0127400 A1* | 6/2011 | Kastelijn | F16F 15/02 | 248/550 |
| 2012/0242271 A1* | 9/2012 | Van Der Toorn | G03F 7/709 | 318/561 |
| 2014/0021324 A1* | 1/2014 | Schumacher | F16M 11/20 | 248/550 |

FOREIGN PATENT DOCUMENTS

| | | |
|---|---|---|
| JP | 2012-097786 A | 5/2012 |
| JP | 2013-249916 A | 12/2013 |

\* cited by examiner

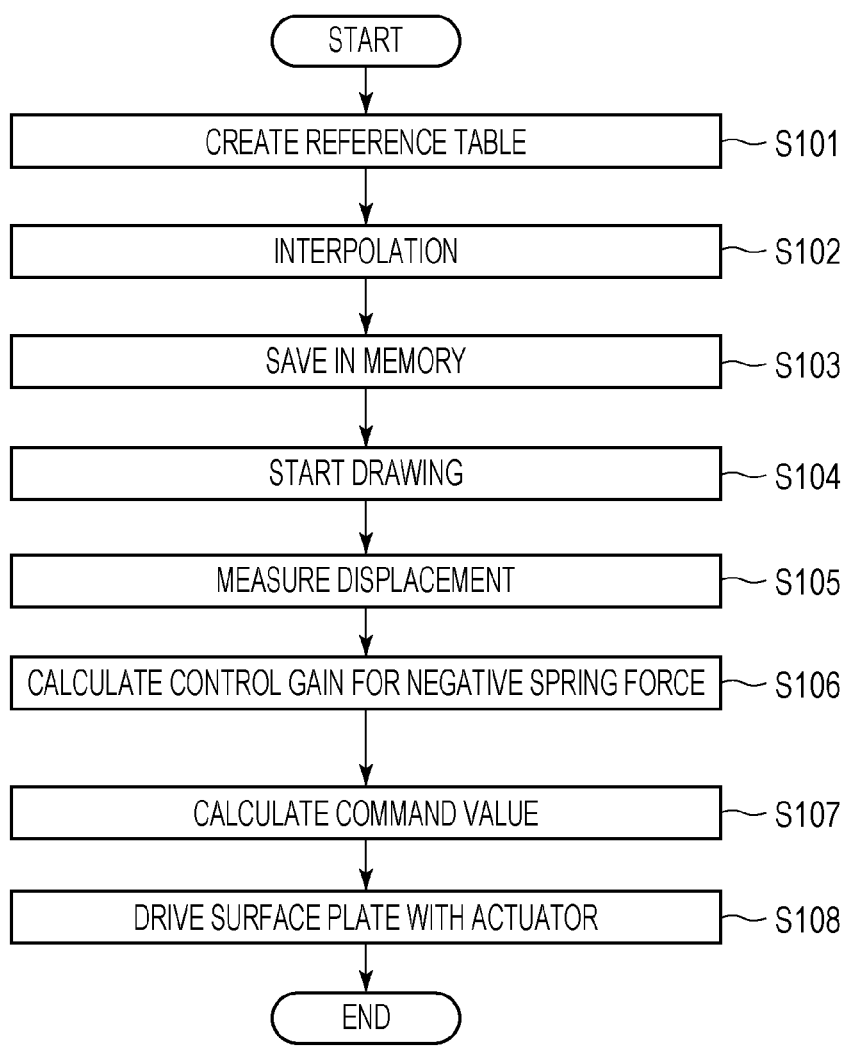

VIBRATION ISOLATION APPARATUS, METHOD OF ISOLATING VIBRATION, LITHOGRAPHY APPARATUS, AND METHOD OF PRODUCING DEVICE

BACKGROUND OF THE INVENTION

Field of the Invention

The present invention relates to a vibration isolation apparatus, a method of isolating vibration, a lithography apparatus that includes the vibration isolation apparatus disposed therein, and a method of producing a device.

Description of the Related Art

In apparatuses that perform precision measurement such as lithography apparatuses for manufacturing a semiconductor, atomic force microscopes, and scanning electron microscopes, measurement errors may be caused by receiving external vibration such as floor vibration. In order to address this, vibration isolation is required for these apparatuses so as to minimize transmission of external vibration to the apparatuses.

In a known related-art vibration isolation apparatus for precision measurement, an object is supported by an air spring, the natural frequency of which is smaller than that of a metal spring and which can suppress vibration of a large frequency band width. Examples of the vibration isolation apparatus featuring improved vibration isolation performance include a vibration isolation apparatus described in Japanese Patent Laid-Open No. 2009-47282. In this vibration isolation apparatus, by applying a force in the same direction as a direction in which an object is displaced, the natural frequency of a support system is reduced, and accordingly, the vibration isolation performance is improved.

Japanese Patent Laid-Open No. 2009-47282 describes a method of applying the force in the same direction as the direction of displacement of the object. In this method, the natural frequency is reduced by applying a force, which is calculated by multiplying displacement of an object by a fixed negative constant (−K). However, as patterns drawn by lithography apparatuses for manufacturing a semiconductor become miniaturized, further reduction of the natural frequency is required for vibration isolation apparatus.

SUMMARY OF THE INVENTION

An object of the present invention is to provide a vibration isolation apparatus with which the natural frequency can be reduced, and accordingly, the vibration isolation performance can be improved compared to the case where vibration isolation is performed by using a fixed negative constant.

According to an aspect of the present invention, a vibration isolation apparatus includes a support unit that elastically supports an object to a mounting surface, a measurement sensor that measures a displacement of the object relative to the mounting surface, a drive unit that drives the object, and a storage unit that stores data indicating a relationship between the displacement of the object and information that indicates a non-linear force produced by an elastic element including the support unit and that corresponds to the displacement. In the vibration isolation apparatus, the drive unit drives the object in accordance with the data and the displacement measured by the measurement sensor.

Further features of the present invention will become apparent from the following description of exemplary embodiments with reference to the attached drawings.

BRIEF DESCRIPTION OF THE DRAWINGS

FIG. 4 is a flowchart illustrating a method of isolating vibration according the first embodiment.

DESCRIPTION OF THE EMBODIMENTS

First Embodiment

Configuration of Apparatus

Figure 1:
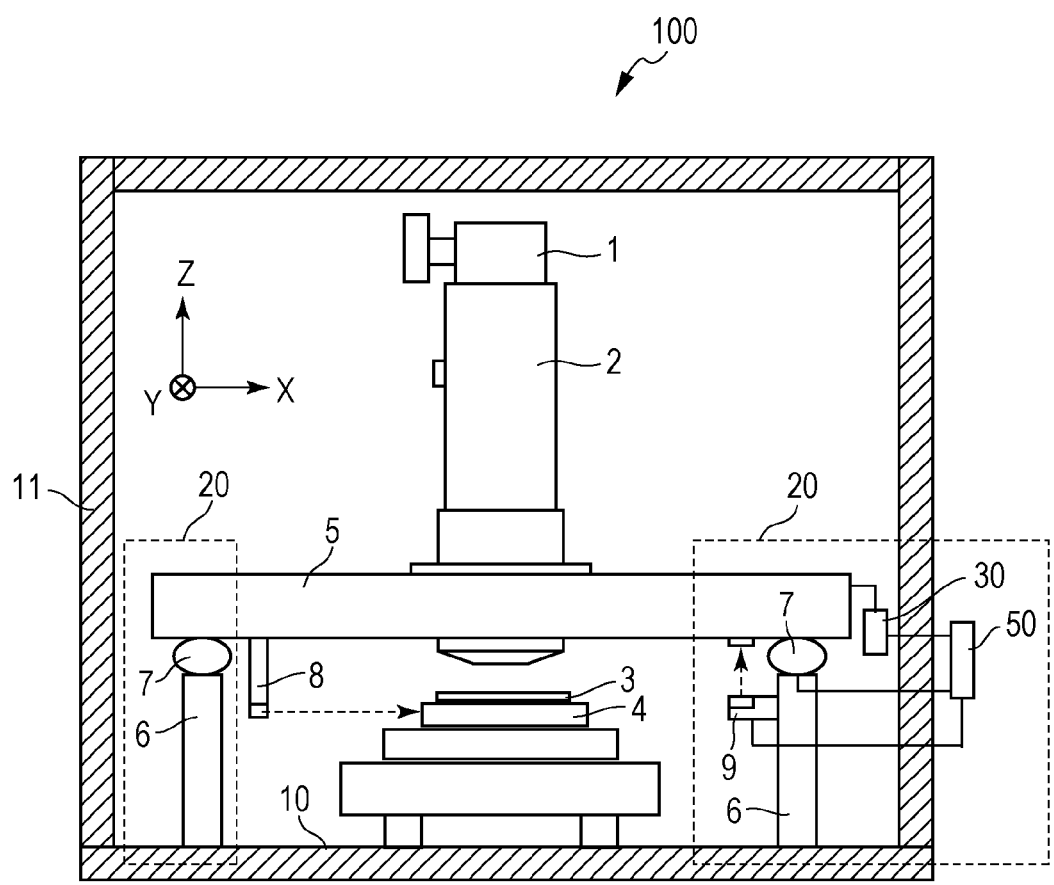
FIG. 1 illustrates the configuration of a drawing apparatus that includes a vibration isolation apparatus disposed therein according to a first embodiment.

FIG. 1 illustrates the configuration of a drawing apparatus (lithography apparatus) 100 that includes vibration isolation apparatuses 20 according to a first embodiment of the present invention disposed therein. Although the vibration isolation apparatuses 20 are disposed in the drawing apparatus 100 that draws patterns by using a single focused electron beam in an example described in the first embodiment, the number of electron beams are not limited to this. The drawing apparatus may use a plurality of electron beams. The vibration isolation apparatus according to the present embodiment can also be applied to any of a variety of apparatuses for which high vibration isolation performance is required such as lithography apparatuses, in which a various beams are radiated or which use an imprint technology, and precision measurement sensors.

An electron source 1 emits an electron beam, which is directed to a substrate 3 by an electro-optical system 2. The substrate 3 is held by a stage 4, which is movable in the X, Y, and Z-axis directions. Supports 6 and mounts 7 are disposed on a floor 10 that serves as a mounting surface and support a surface table 5 that serves as an object. The electro-optical system 2 is disposed such that part of the electro-optical system 2 extends through the surface table 5 at a through hole formed at the center of the surface table 5.

By considering controlling of vibration in six axial directions to which the surface table 5 is subjected, at least three sets of the support 6 and the mount 7 are provided. The mounts 7 each serve as a support unit. The mounts 7 elastically supporting the surface table 5 each use an air spring. Each of the mount 7 suppresses propagation of the vibration to the surface table 5 by utilizing an elastic force of compressed air. The spring constant of the air spring is a value that varies corresponding to a displacement of the surface table 5. The mount 7 also has the function of an actuator, adjusting the pressure of the compressed air so as to adjust the position and the attitude of the surface table 5.

Objects that transmit vibration to the surface table 5 are not limited to the supports 6 and the mounts 7. In the case of the drawing apparatus 100, examples of media that propagate vibration to the surface table 5 include objects directly or indirectly connected to the surface table 5 such as a cable (not illustrated), a cooling tube (not illustrated), and a bellows (not illustrated). Thus, the media including the supports 6 and the mounts 7 that propagate vibration to the surface table 5 are collectively referred to as an elastic element 60 (see FIG. 5, which will be described later) hereafter. The spring constant of the elastic element 60 is not fixed, and the surface table vibrates while being affected by a non-linear force produced corresponding to the displacement of the surface table 5 caused by the elastic element 60.

Interferometers 8 provided on the surface table 5 emit laser light to mirrors (not illustrated) provided on the stage 4 and detect the laser light reflected by the mirrors, thereby measuring the position of the stage 4. A pattern is drawn on the substrate 3 by using the electron beam while the stage 4 is being moved in accordance with the measurement results.

A displacement sensor 9 (measurement sensor) is secured to each of the supports 6 and measures the position of the surface table 5. By obtaining variations of the measured position, the displacement of the surface table 5 relative to the floor 10 is measured.

The displacement sensors 9 use sensors such as optical sensors, eddy current displacement sensors, or capacitance sensors. The displacement sensors 9 are provided at a plurality of positions, thereby measuring relative displacements of the surface table 5 in the six axial directions. It is required that, in the case where eddy current sensors or capacitance sensors are used, metal plates be provided so as to oppose these sensors, and in the case where, for example, interferometers are used as optical sensors, mirrors be provided so as to oppose the interferometers. When the metal plates or the mirrors are required in accordance with the types of the displacement sensors 9 to be used, the metal plates or the mirrors are disposed appropriate positions in the surface table 5.

The vibration isolation apparatus 20 according to the present embodiment includes the support 6, the mount 7, the displacement sensor 9, an actuator 30 (drive unit), and a controller 50. Upon reception of an instruction from a controller A 54 included in the controller 50, the actuator 30 applies a force to the surface table 5 so as to drive the surface table 5. The details of the controller A 54 will be described later. A direction in which the actuator 30 applies the force to the surface table 5 can be the same as a direction in which the surface table 5 being subjected to vibration is displaced. The actuator 30 may apply the force to the surface table 5 in a direction that includes a component of the displacement direction. The force applied to the surface table 5 by the actuator 30 acts in such a direction that a positive spring force of the elastic element 60 including the mount 7 is canceled out. Thus, the force applied to the surface table 5 by the actuator 30 is referred to as a negative spring force hereafter.

Although a single actuator 30 is illustrated in FIG. 1, actually, a plurality of the actuators 30 are disposed at positions so as to drive the surface table 5 in the X, Y, and Z directions, thereby isolating the surface table 5 from vibration. The actuators 30 can be electromagnetic actuators such as linear motors or electromagnetic motors. The reason for this is that the electromagnetic actuators have advantages in that the electromagnetic actuators exhibit good responsiveness and drive objects in a non-contact manner, thereby propagation of vibration can be decreased. The actuators 30 may also use air actuators similar to the mounts 7, actuators utilizing piezoelectric elements, or the like. Furthermore, a combined use of these different types of actuators for the actuators 30 is possible.

Figure 2:
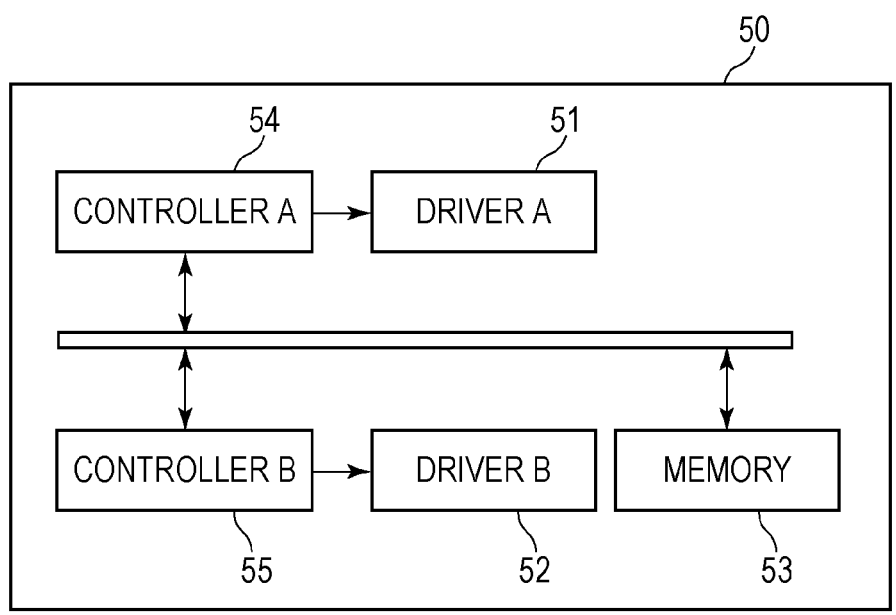
FIG. 2 illustrates the configuration of a controller of the drawing apparatus according to the first embodiment.

FIG. 2 illustrates the configuration of the controller 50. The controller A 54 executes a program, which will be described later and is illustrated in a flowchart in FIG. 4, stored in a memory 53 (storage unit). When executing the program, the controller A 54 outputs command values, which are digital signals, as command information for driving the actuator 30 through a driver A 51 in accordance with measurement values measured by the displacement sensor 9. By control performed by the controller A 54, a reference table, which will be described later, is created, and the negative spring force is controlled. Although a plurality of the actuators 30 are connected to the respective controllers 50 in the present embodiment, all of the plurality of actuators 30 may be connected to a single controller 50.

A controller B 55 outputs a command value to the mount 7 through a driver B 52 in accordance with a measurement value measured from the displacement sensor 9. Thus, positioning control for positioning the surface table 5 at a predetermined position relative to the floor 10 is performed.

The driver A 51 converts the command values output from the controller A 54 to current values, amplifies the current values, and inputs the amplified current values to the actuators 30. The driver B 52 converts the command values output from the controller B 55 to current values, amplifies the current values, and inputs the amplified current values to the mounts 7. The program, which will be described later and is illustrated in the flowchart in FIG. 4, is stored in the memory 53.

The memory 53 also stores data that indicates the relationships between the displacement of the surface table and information that indicates a non-linear force produced by the elastic element 60 corresponding to the displacement of the surface table 5. This information indicating the non-linear force produced by the elastic element 60 includes, for example, either the force produced by the elastic element 60 or the spring constant of the elastic element 60. That is, the memory 53 stores, for example, the following data: data that indicates the relationship between an external force applied to the surface table 5 and the displacement of the surface table 5 determined by being affected by the external force and the force produced by the elastic element 60; and data that indicates the relationship between the displacement of the surface table 5 and the spring constant of the elastic element 60 that varies corresponding to the displacement of the surface table 5.

Referring back to FIG. 1, the aforementioned components except for the controller 50 are disposed in a vacuum chamber 11. The inside of the vacuum chamber 11 is maintained under vacuum by evacuating the vacuum chamber 11 with a vacuum pump (not illustrated).

Need for Vibration Isolation

Figure 3A:
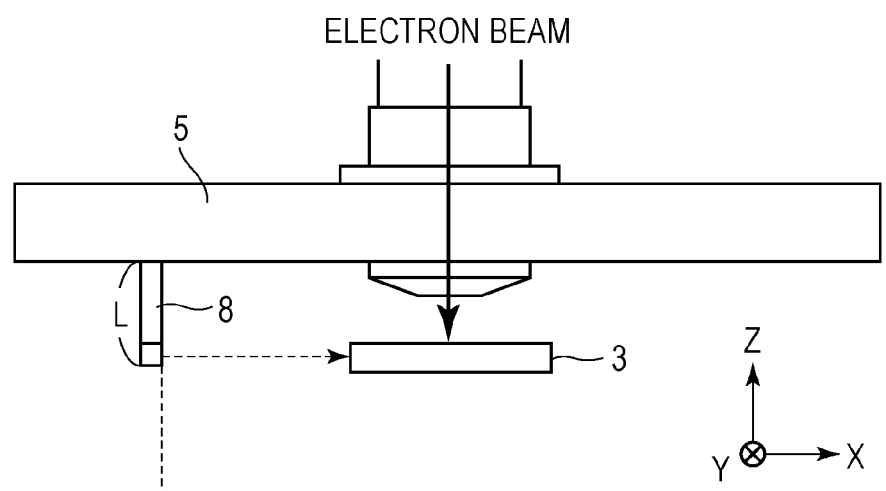
FIGS. 3A and 3B illustrate a measuring error observed in measurement with an interferometer.
Figure 3B:
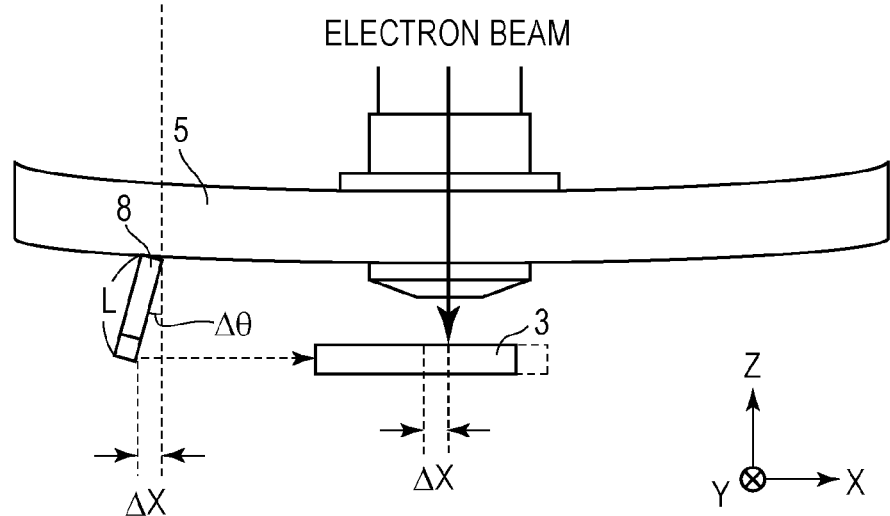

Next, referring to FIGS. 3A and 3B, the reason why high vibration isolation performance is required for the drawing apparatus 100 is explained. It is assumed that vibration in, for example, the Z direction changes the relative distance between the mounting surface and the surface table 5 by $\Delta Z$ in the Z-axis direction. At this time, the relationship between the spring constant $Kz$ of the elastic element 60 in the Z direction and a force $Fz$ applied to the surface table 5 by the elastic element 60 in the Z direction is represented as follows: $Fz = Kz \times \Delta Z$, where $Kz$ denotes the sum of the spring constants in the Z direction of the components of the elastic element 60.

The surface table 5 is deformed as a result of application of the force Fz to all the surfaces of the surface table 5 because of vibration and application of a force that supports the surface table 5 at a support point of the surface table 5. FIGS. 3A and 3B illustrate a measurement error of the interferometer 8. FIG. 3A illustrates a state of the surface table 5 and a region around the surface table 5 before deformation. FIG. 3B illustrates a state of the surface table 5 and the region around the surface table 5 after the deformation. When the surface table 5 is deformed so as to be convex toward the substrate 3 as illustrated in FIG. 3B, the interferometer 8 having a length of L disposed on the surface table 5 is inclined in a direction separating from the substrate 3 by $\Delta\theta$ compared to the state illustrated in FIG. 3A. Thus, a light emitting position of a laser beam emitted from the interferometer 8 is shifted in the −X direction by $\Delta X = L \times \sin(\Delta\theta)$.

That is, although the position of the substrate 3 is not changed before and after the deformation of the surface table 5, the measurement value is changed by $\Delta X$. Since the movement amount of the stage 4 is determined in accordance with a measurement result of the interferometer 8, the substrate 3 is positioned at a wrong position shifted by $\Delta X$ from the predetermined position as illustrated in FIG. 3B due to the change in the measurement value. Thus, a wrong position of the substrate 3 is irradiated with the electron beam, resulting in an error in drawing. Although relative displacement in the Z direction occurs between the surface table 5 and the floor 10 in the example described above, the directions of relative displacement are not limited to the Z direction. Thus, vibration isolation against vibration in each of the directions is required for the drawing apparatus 100.

The measurement error of the interferometer 8 causes distortion of a drawing pattern drawn by the electron beam on the substrate 3 at last. For this reason, along with a latest trend of miniaturization of drawing patterns, higher vibration isolation performance is required. This is required not only for the drawing apparatus 100 but also similarly for other lithography apparatuses.

Method of Isolating Vibration

Figure 5:
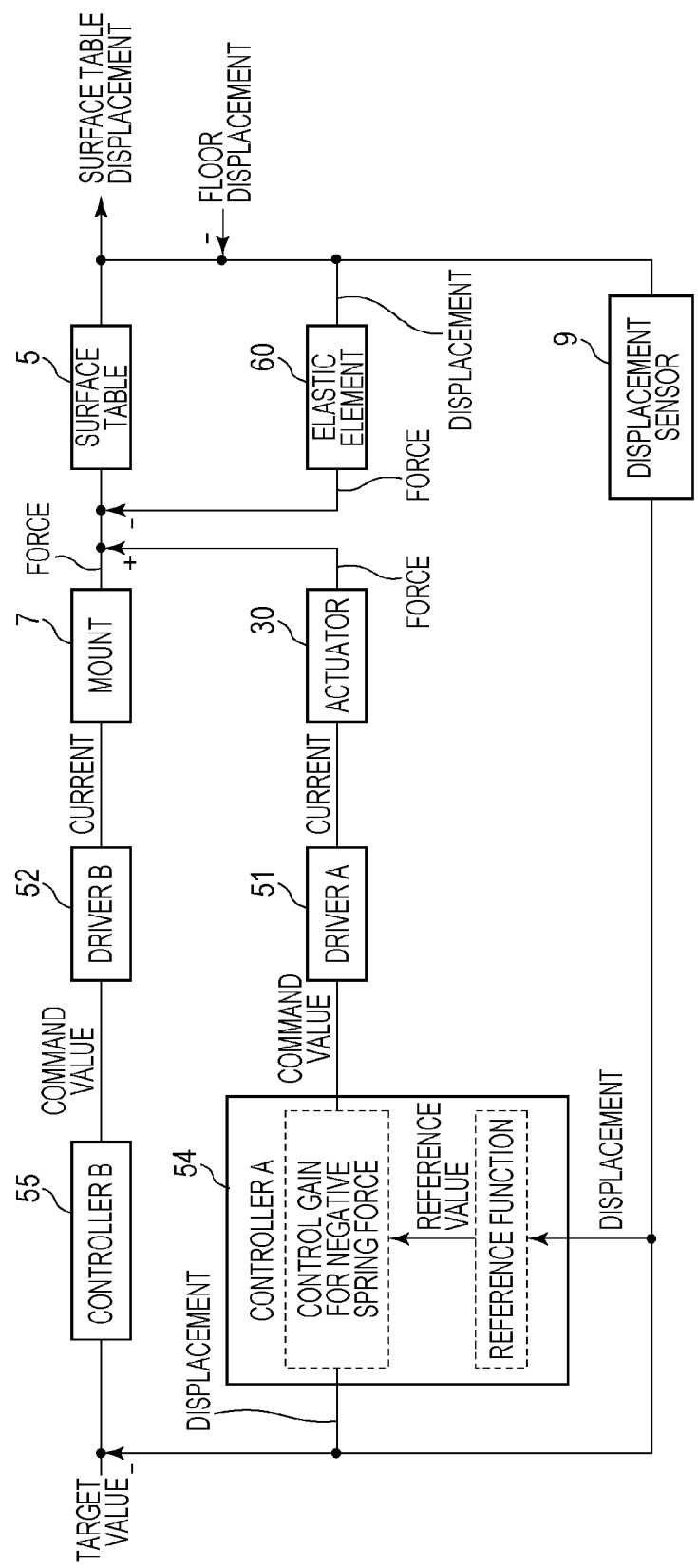
FIG. 5 illustrates the details of control according to the first embodiment.

Next, a method of isolating vibration for the surface table 5 by using the vibration isolation apparatus 20 according to the present embodiment will be described with reference to FIGS. 4 and 5. FIG. 4 is a flowchart illustrating the method of isolating vibration with the controller A 54. FIG. 5 illustrates the details of control of the vibration isolation apparatus 20 according to the first embodiment.

While control described below is being performed, the controller B 55 continuously outputs a control command value. That is, the controller B 55 performs positioning control that positions the surface table 5 at a predetermined position relative to the floor 10 in accordance with measurement value measured by the displacement sensor 9. Among forces required for the positioning, a force required to correct fluctuations in position and attitude of the surface table 5 corresponds to a spring force of a spring, the natural frequency of which is smaller than those of the positive spring force produced by the elastic force of the mount 7 and the negative spring force controlled in accordance with instructions from the controller A 54.

In S101, the controller A 54 creates a reference table. The reference table shows the relationship between a force applied to the surface table 5 in predetermined direction and the displacement of the surface table 5 determined by being affected by the elastic element 60 and the force applied to the surface table 5. The surface table 5 is moved by the actuator 30 while measuring the displacement of the surface table 5 by the displacement sensor 9. The reference table is created by recording the relationships between forces applied by the actuator 30 and the displacements for a plurality of target displacements.

The reference tables are created for at least the X, Y, and Z directions. The reference tables for other three axial directions may be created by using the results in the X, Y, and Z directions or in accordance with measurement.

The force applied by the actuator 30 can be calculated from the command value of the controller A 54 used to drive the actuator 30. The difference between any one of the target displacements and the next target displacement may be the same or vary. However, when it is recognized in advance that the amount of change in force to be applied is large in a certain displacement range, the difference between the target displacements can be small in such a displacement range.

In S102, the controller A 54 performs an interpolation process on the reference table created in S101. Examples of a method of the interpolation process include, for example, generating a function through approximation by a second or third order polynomial. When control accuracy of the actuator 30 is high, approximation by a fourth or higher order polynomial may be used. Alternatively, the interpolation process may be performed by spline approximation that uses different functions for approximation in different ranges of plotted target displacements.

Here, the function (referred to as reference function hereafter) created by the interpolation process performed on the reference table are data indicating relationship between external force applied to the surface table 5 and relative displacement of the surface table 5 non-linearly determined by being affected by the external force and spring force produced by the elastic element 60.

In S103, the controller A 54 stores the reference function obtained in S102 in the memory 53. The above-described processes are processes performed before the electron beam is radiated to the substrate 3.

In S104, the electron source 1 emits the electron beam. Thus, the formation of a pattern latent image of a circuit pattern or the like on the resist on the substrate 3 is started. After drawing has been started, a vibration isolation process for the surface table 5 is performed so as not to cause distortion of the surface table 5. In the following S105 to S108, processes that isolate vibration by applying a negative spring force to the surface table 5 are described.

In S105, relative displacement of the surface table 5 relative to the floor 10 is measured by the displacement sensor 9. The measurement value of the relative displacement is converted into a digital signal by an analog to digital (A/D) converter (not illustrated), and the resultant signal is input to the controller A 54.

In S106, the controller A 54 calculates a control gain for the negative spring force. The control gain for the negative spring force is a proportional gain calculated by dividing a force corresponding to the measured relative displacement obtained by using the reference function by the relative displacement.

Next, in S107, the controller A 54 outputs the command value for driving the actuator 30. The command value is obtained by multiplying the relative displacement, which is measured in S105, by the control gain for the negative spring force obtained in S106. The command value having been output is converted into analog signal by a digital to analog (D/A) converter (not illustrated). The resultant analog signal is converted into a current value by the driver A 51, and the resultant current value is input to the actuator 30.

In S108, the actuator 30 drives the surface table 5 in accordance with the current value having been input thereto. The force here is applied in the same direction as the relative displacement direction of the surface table 5, that is, applied in such a direction that the applied force cancels off the force applied by the elastic element so as to return the surface table 5 to the original position.

Thus, through the processes in S105 to S108, the force produced by the elastic element 60 is reduced regardless of the magnitude of the relative displacement of the surface table 5. The processes in S105 to S108 are repeated until drawing performed on the substrate 3 is completed, and an exposure step with the drawing apparatus 100 is completed.

The main force applied to the surface table 5 is spring force of a spring of small natural frequency applied from the mount 7 upon receipt of the control command from the controller B 55. However, even when the main force applied to the surface table 5 is the reduced force applied by the elastic element 60, the natural frequency of the support system is similarly reduced. Thus, the vibration isolation performance can be improved.

The vibration isolation apparatus 20 according to the present embodiment and the method of isolating vibration with the vibration isolation apparatus 20 have been described. The vibration isolation apparatus according to the present embodiment controls vibration isolation with consideration of the spring constant of the elastic element 60 that varies corresponding to the displacement of the surface table 5. In the case where the control gain for the negative spring force is treated as a fixed value, the force applied may be excessively large or excessively small depending on the displacement of the surface table 5 when the negative spring force is controlled. How to obtain the negative constant (−K), which corresponds to the control gain for the negative spring force, is not particularly described in the related art. However, when control is performed by using the non-fixed control gain for the negative spring force calculated in accordance with a measured value similarly to the present embodiment, the natural frequency of the support system can be reduced.

Since vibration isolation is performed with consideration of the spring constant of the elastic element 60 that varies corresponding to the displacement of the surface table 5 as described above, stable high vibration isolation performance can be provided regardless of relative displacement of the surface table 5. Thus, in the drawing apparatus 100 that includes the vibration isolation apparatus according to the present embodiment therein, errors in positioning of the substrate 3 caused by vibration can be suppressed, and accordingly, a latent image of a fine pattern can be precisely formed.

Method of Producing Device

A method of producing a device according to the present invention includes: a step of transferring a pattern while isolating an object from vibration by using the lithography apparatus according to the present invention; and a step of etching a substrate where the pattern has been transferred. Furthermore, the method of producing a device may include other known steps (such as oxidation, coating, deposition, developing, doping, planarization, resist removing, dicing, bonding, and packaging).

Second Embodiment

Figure 6:
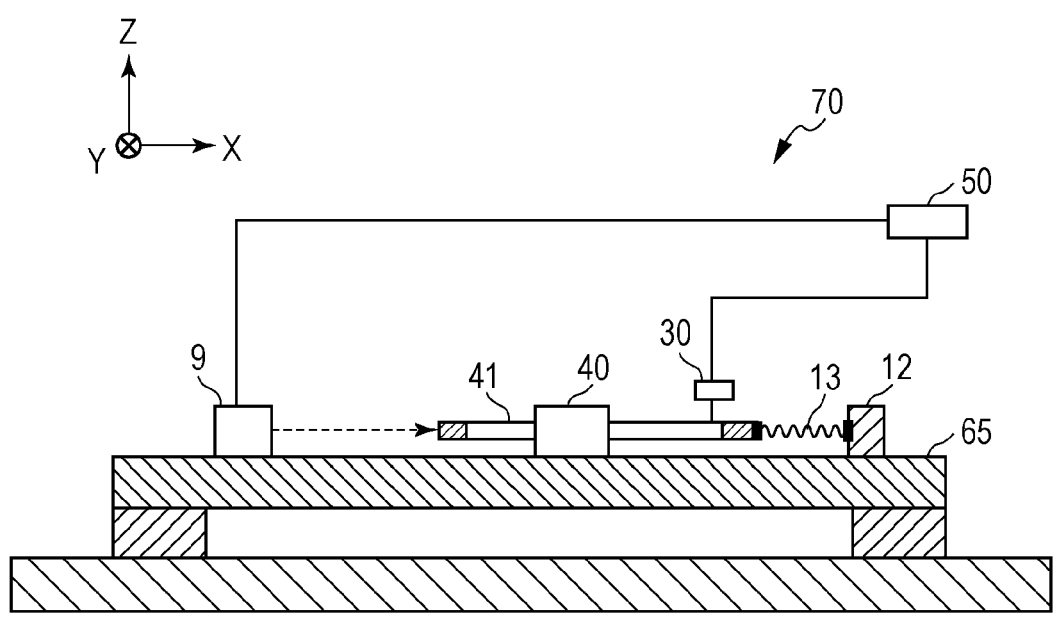
FIG. 6 illustrates the configuration of a vibration isolation apparatus according to a second embodiment.

Next, a vibration isolation apparatus according to a second embodiment is described with reference to FIG. 6. The second embodiment relates to a vibration isolation apparatus 70 that performs vibration isolation in a single axial direction (X-axis direction). A securing member 12, an air slider 40, and the displacement sensor 9 are disposed on a mounting surface 65. A guide 41 is inserted through the air slider 40. In the present embodiment, the guide 41 serves as the object. A coil spring 13 is connected to the tip end of the guide 41. The coil spring 13 serves as a support unit that elastically supports the guide 41. Another end of the coil spring 13 is connected to the securing member 12.

The actuator 30 is connected to the guide 41. The actuator 30 applies a negative spring force similarly to the actuator 30 in the first embodiment. The actuator 30 also positions the guide 41 at a predetermined position similarly to the mount 7 in the first embodiment. Displacement of the guide 41 relative to the mounting surface 65 is measured by using the displacement sensor 9.

The details of control of the vibration isolation apparatus 70 according to the present embodiment are similar to those illustrated in FIG. 4. In the present embodiment, the guide 41 corresponds to the object instead of the surface table 5 in the first embodiment, and the actuator 30 corresponds to the drive unit instead of the mount 7 and the actuator 30 of the first embodiment. Furthermore, the coil spring 13 and other spring components that transmit vibration to the guide 41 correspond to the elastic element 60. In the controller 50, the reference data and the reference function stored in the memory 53 is those relating to the X-axis direction.

Example

An example of the vibration isolation apparatus 70 according to the present embodiment is described. The actuator 30 used a linear motor. The displacement sensor 9 used a laser displacement meter.

Initially, the reference table of the present embodiment was created by the aforementioned method, and the spring constant K for each measurement displacement x was calculated. A reference function K=f(x) was obtained by approximating a graph representing the spring constant K for each displacement x by a second order polynomial. The reference function K=f(x) was stored in the memory 53.

Next, in order to check the vibration isolation performance of the vibration isolation apparatus 70 when external vibration is applied to the guide 41, vibration was applied to the guide 41 through the actuator 30, and the frequency response was measured. At this time, by using the actuator 30, not only the guide 41 was vibrated corresponding to the frequency, but also the negative spring force was controlled corresponding to the relative displacement of the guide 41.

Figure 7:
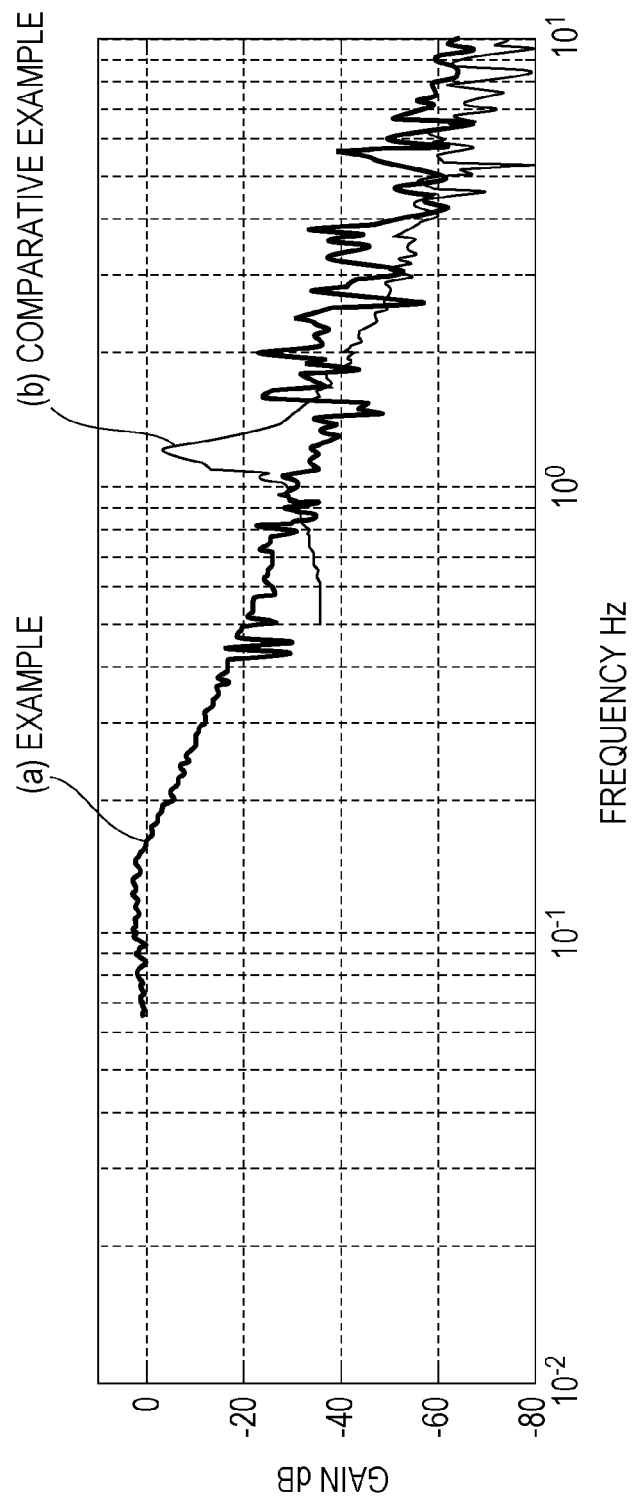
FIG. 7 illustrates the vibration isolation ratio by the vibration isolation apparatus according to the second embodiment.

A measurement result of the frequency response in the present example is illustrated in a graph (a) of FIG. 7. The vertical axis represents the gain and the horizontal axis represents the frequency of vibration applied to the guide 41. The gain is the ratio of displacement that the actuator 30 attempts to apply to the guide 41 and the displacement of the guide 41 actually moved while being affected by the coil spring 13, the ratio being represented in accordance with the common logarithm. As a result of control using the controller A 54 and the controller B 55, the natural frequency of the spring is 0.13 Hz.

Comparative Example

As a comparative example of the example, a case in which the negative spring force is not controlled is described. The differences between the example and comparative example are that, in the comparative example, the controller 50 does not include the controller A 54 and the driver A 51, and data corresponding to the aforementioned reference function is not stored in the memory 53. That is, when external vibration was applied, only the following control was performed: the controller B 55 performed positioning control to position the guide 41 at the predetermined position, the positioning control attempting to return the guide 41 to the original position.

A measurement result of the frequency response of the vibration isolation apparatus 70 of the comparative example is illustrated in a graph (b) of FIG. 7. The natural frequency is 1.2 Hz. The result means that the force corresponding to the spring constant of the coil spring 13 and other spring components that transmit vibration to the guide 41 cannot be sufficiently canceled out. Thus, the vibration isolation effect is low.

Thus, the vibration isolation performance has been examined by using the vibration isolation apparatus 70 according to the second embodiment. As a result, it has been recognized that, by controlling the negative spring force for the guide 41 serving as the object, the vibration isolation performance is obtained also in a single axis vibration system.

Other Embodiments

Supplementary matter common to the first and second embodiments is described. In the first or second embodiment, as the support unit that elastically supports the object (surface table 5 or guide 41) relative to the mounting surface, the mount 7 or the coil spring 13 is used. Instead, vibration-proof rubber or other elastic body producing the vibration isolation effect may be used.

Although a direction in which the actuator 30 drives the object (surface table 5 or guide 41) can be the same as the direction in which the object is displaced, it is sufficient that the object be driven in a direction that includes a component of the displacement direction. The reason for this is that vibration of the object can be reduced as long as a force is applied in a direction in which a force corresponding to the spring constant of the elastic element 60 is reduced.

When creating the reference table, the unit that applies a force to the object is not necessarily the actuator 30. The reference table may be created by applying an external force with a method other than using the actuator 30 and measuring a force required for the external force with push-pull gauges or load cells. Instead of driving the actuator 30 so as to displace the surface table 5 by the target displacement, the reference table may be created by measuring the displacement of the surface table 5 that is driven when the actuator 30 attempts to apply a target force. Alternatively, the reference table may be created in accordance with simulation results obtained by simulating the object and the main elastic element 60.

The reference function obtained by using the reference table having been created is not necessarily represents the relationship between the external force applied to the object and displacement caused by the external force. As described in the second embodiment, the relationship between the spring constant of the elastic element 60 approximated by a first or second order polynomial and the relative displacement of the object may be obtained and stored in the memory 53 after the spring constant of the elastic element 60 corresponding to the relative displacement has been obtained. Furthermore, when fine plotting is performed for creating the reference table in S101, the interpolation process in S102 may be omitted.

A further control using an acceleration sensor, which is a typical related-art control, could be performed in the first and second embodiments. When the control using the acceleration sensor is realized, a peak gain at the natural frequency can be reduced and vibration due to known specific disturbance can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-139005, filed Jul. 2, 2013, which is hereby incorporated by reference herein in its entirety.

What is claimed is:

1. A vibration isolation apparatus comprising:
   a support unit configured to elastically support an object to a mounting surface;
   a measurement sensor configured to measure a displacement of the object relative to the mounting surface;
   a drive unit configured to drive the object; and
   a storage unit configured to store data indicating a relationship between the displacement of the object and information that indicates a non-linear force produced by an elastic element including the support unit, the non-linear force varies corresponding to the displacement of the object,
   wherein the drive unit drives the object in a direction that includes a component of a displacement direction of the object in accordance with the data and the displacement of the object measured by the measurement sensor.

2. The vibration isolation apparatus according to claim 1, wherein the information includes a spring constant of the elastic element corresponding to the displacement of the object.

3. The vibration isolation apparatus according to claim 1, wherein the drive unit drives the object in a direction in which the force produced by the elastic element is reduced so as to isolate the object from vibration.

4. The vibration isolation apparatus according to claim 1, wherein the support unit includes an air spring that is controlled in accordance with the displacement measured by the measurement sensor.

5. The vibration isolation apparatus according to claim 4, wherein the air spring is controlled so that the object approaches a predetermined position.

6. The vibration isolation apparatus according to claim 2, wherein the drive unit drives the object in accordance with a value obtained by multiplying the spring constant by the displacement measured by the measurement sensor.

7. The vibration isolation apparatus according to claim 1, wherein the drive unit is a non-contact type actuator.

8. A vibration isolation apparatus comprising:
   a support unit that elastically supports an object to a mounting surface;
   a measurement sensor that measures a displacement of the object relative to the mounting surface;
   a drive unit that drives the object; and
   a storage unit that stores data indicating a relationship between the displacement of the object and a spring constant that varies corresponding to the displacement,
   wherein the drive unit drives the object in a direction that includes a component of a displacement direction of the object in accordance with command information calculated by multiplying the displacement measured by the measurement sensor by the spring constant corresponding to the displacement in the relationship.

9. A method of isolating vibration that isolates an object from vibration, the method comprising the steps of:
   measuring a displacement of the object in a predetermined direction relative to a mounting surface;
   obtaining data that indicates a relationship between the displacement of the object and information that indicates a non-linear force produced by an elastic element including a unit elastically supporting the object, the non-linear force varies corresponding to the displacement of the object; and
   driving the object in a direction that includes a component of a displacement direction of the object in accordance with the data and the displacement measured by the measurement sensor.

* * * * *